United States Patent
Stamper (12)

(10) Patent No.: US 6,319,818 B1
(45) Date of Patent: Nov. 20, 2001

(54) PATTERN FACTOR CHECKERBOARD FOR PLANARIZATION

(75) Inventor: Anthony K. Stamper, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/224,778

(22) Filed: Jan. 4, 1999

(51) Int. Cl.[7] .................. H01L 21/44; H01L 21/4763
(52) U.S. Cl. ..................... 438/631; 438/598; 438/926
(58) Field of Search ............................. 438/129, 599, 438/631, 598, 926

(56) References Cited

U.S. PATENT DOCUMENTS

| | | | |
|---|---|---|---|
| 5,278,105 | 1/1994 | Eden et al. ........................ | 437/250 |
| 5,292,689 | 3/1994 | Cronin et al. ..................... | 437/228 |
| 5,539,240 | 7/1996 | Cronin et al. ..................... | 257/520 |
| 5,888,900 | * 3/1999 | Mizuno ............................. | 438/631 |
| 5,915,201 | * 6/1999 | Chang .............................. | 438/631 |

OTHER PUBLICATIONS

IBM Technical Disclosure Bulletin, vol. 26, No. 10A, Mar. 1984 p. 4995, Planarization of Conductor Surfaces, W. M. Goubau.

* cited by examiner

Primary Examiner—Charles Bowers
Assistant Examiner—Nema Berezny
(74) Attorney, Agent, or Firm—John J. Goodwin

(57) ABSTRACT

A method of fabricating a semiconductor device on a semiconductor wafer of the type having a plurality of active layers that includes the steps forming a layout for at least one of the active layers where the layout contains a plurality of active region segments and a plurality of inactive regions. The layout is then modified by adding a plurality of dummy active segments in the inactive regions. The layout is further modified by removing a plurality of sub-regions from the active regions to form a plurality of sub-inactive regions. The semiconductor wafer is then processed using the modified layout to provide an environment during the processing of the active layer wherein the relative area of the active to the inactive regions is substantially equal across the wafer.

17 Claims, 3 Drawing Sheets

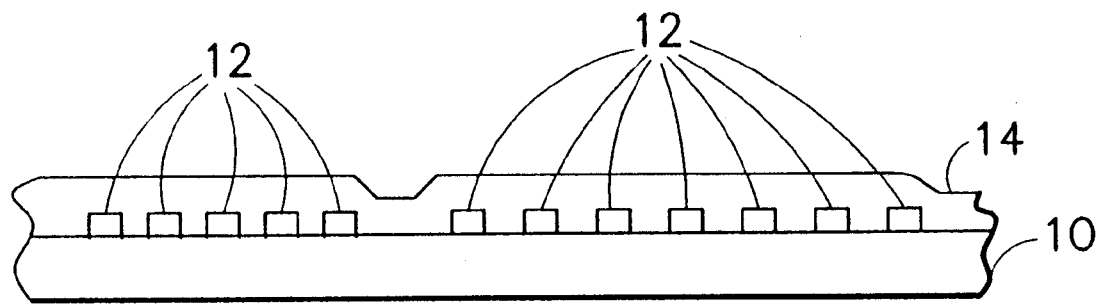
FIG. 4a (A-A)
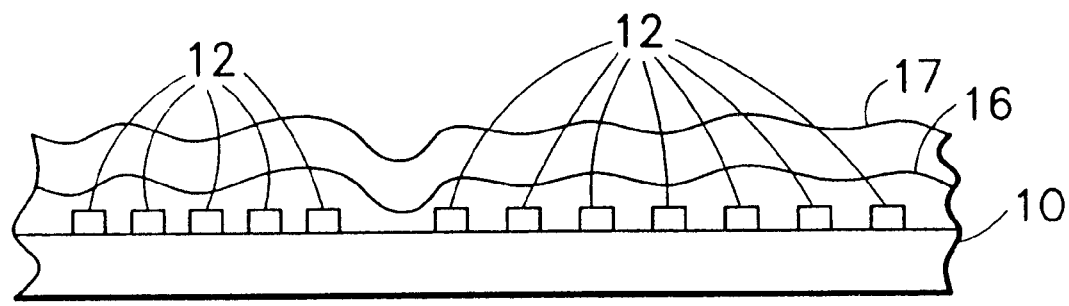
FIG. 4b (B-B)

PATTERN FACTOR CHECKERBOARD FOR PLANARIZATION

BACKGROUND OF THE INVENTION

1. Field of the Invention

The present invention relates to the fabrication of semiconductor structures, and more particularly to methods for planarizing patterned conductors using a pre-mask checkerboarding of wiring lines.

2. Background Art

Planarization methods in the fabrication of semiconductor devices are disclosed in U.S. Pat. No. 5,278,105 issued Jan. 11, 1994 to Eden et al. entitled SEMICONDUCTOR DEVICE WITH DUMMY/FEATURE IN, ACTIVE LAYERS that discloses a design and fabrication method for a semiconductor device that allows different types of devices to be processed using the same process steps.

U.S. Pat. No. 5,292,689 issued Mar. 8, 1994 to Cronin et al. entitled METHOD FOR PLANARIZING SEMICONDUCTOR STRUCTURE USING SUBMINIMUM FEATURES discloses a method for fabricating planarized semiconductor structures that are prepared using a plurality of subminimum polysilicon vertical pillars by chemical vapor deposition to prevent depressions in the planarized surface.

U.S. Pat. No. 5,539,240 issued Jul. 23, 1996 to Cronin et al. entitled PLANARIZED SEMICONDUCTOR STRUCTURE WITH SUBMINIMUM FEATURES also discloses planarized semiconductor structures having subminimum vertical pillars to prevent depressions in the planarized surface.

The IBM Technical Disclosure Bulletin, Vol. 26, No. 10A, March 1984 at page 4995 by W. M. Goubau entitled PLANARIZATION OF CONDUCTING SURFACES discloses a planar coating technique using a wiring pattern with evenly spaced, space-filling conductors.

SUMMARY OF THE INVENTION

An object of the present invention is to provide an improved planarization method for patterned conductors.

Another object of the present invention is to provide an improved planarization method for use with polysilicon conductors, local interconnect and Back End Of Line (BEOL)) wiring.

Still another object of the present invention is to provide an improved planarization technique incorporating a pre-mask fabrication checkerboarding of wiring lines.

Other features, advantages and benefits of the present invention will become apparent in the following description taken in conjunction with the following drawings. It is to be understood that the foregoing general description and the following detailed description are exemplary and explanatory but are not to be restrictive of the invention.

The accompanying drawings which are incorporated in and constitute a part of this invention and, together with the description, serve to explain the principles of the invention in general terms. Like numerals refer to like parts throughout the disclosure.

BRIEF DESCRIPTION OF THE DRAWINGS

FIG. 4a is a side view of FIG. 4 taken through cross-section A—A and FIG. 4b is side view of FIG. 4 taken through cross-section B—B.

DESCRIPTION OF THE INVENTION

Providing proper cross-chip and cross-wafer planarity is a major factor in polysilicon conductor (PC), local interconnect and back end of line (BEOL) wiring processing. In particular, undesired variations in the post-chemical-mechanical polish (CMP) insulator thickness increases the overetch required for vias, increases the overpolish required during CMP due to local dishing, and increases the capacitance variability of back end of line (BEOL) capacitors.

The present invention overcomes these problems by providing a novel method for the type of pre-mask fabrication referred to as the "checkerboarding" of wiring lines. Checkerboarding achieves the desired planarity by reducing the amount of dielectric CMP required with planarizing materials like a spin-on dielectric such as spun-on glass (SOG) or a dielectric formed by high density plasma chemical vapor deposition (HPDCVD).

Many dielectric materials are envisioned including SiO2, polyarylene ether, hydrogen silesquioxanze (HSQ) or methyl silsesquioxanze (MSQ).

Figure 1:
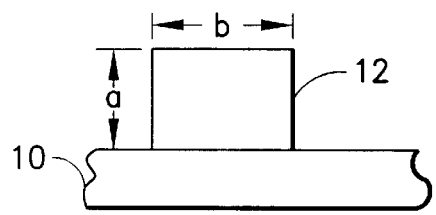
FIG. 1 is a schematic illustration showing a wiring line on a substrate with a line height "a" and a line width "b" and an aspect ratio of height to width of a:b.

Referring to FIG. 1, a substrate 10 is shown containing a, wiring line 12 having a line height "an and a line width "b" wherein the aspect ratio of line height to line width is a:b.

Figure 2:
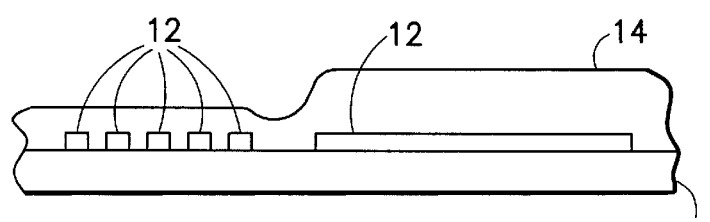
FIG. 2 is a schematic cross-sectional illustration showing as-deposited planarization of spun-on-glass (SOG) or a spun on dielectric.
Figure 3:
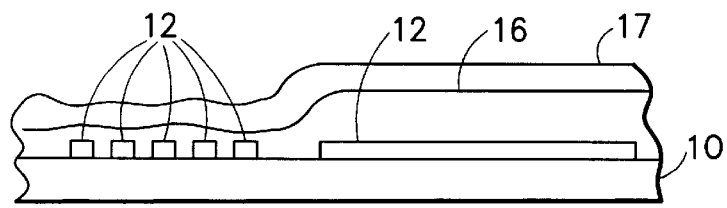
FIG. 3 is a schematic cross-sectional illustration showing as-deposited planarization of high density plasma chemical vapor deposition (HDPCVD) silicon dioxide dielectric.

Referring to FIGS. 2 and 3, planarized chip and wafer areas with metal lines are illustrated after dielectric deposition with aspect ratios a:b greater than approximately 0.5:1. FIG. 2 shows substrate 10 and metal lines 12 with a layer 14 of SOG dielectric. FIG. 3 shows substrate 10 having metal lines 12 and a conformal layer 16 of HDCVD dielectric and a layer 17 of plasma enhanced chemical vapor deposition (PECVD). The PECVD layer 17 is not required. In the structures as shown in FIGS. 2 and 3, the minimum aspect ratio needed for pre-CMP planarization decreases with increasing dielectric deposition thickness. For most applications, 0.5:1 is the lowest cost limit. However, in the embodiment of FIG. 3, by increasing the higher density plasma CVD thickness, this ratio can be decreased. In the case of spun-on-glass of FIG. 2, the aspect ratio can be reduced by optimizing the spun on glass parameters.

In multilayer circuitry, the planar coating of each layer over the circuitry is facilitated by providing space-filling conductors on the substrate that are essentially evenly spaced. This technique is referred to as checkerboarding. The checkerboarding disclosed in the present invention can be employed on both the metal lines and the fill shapes between the metal lines that are used to improve planarization.

Figure 4:
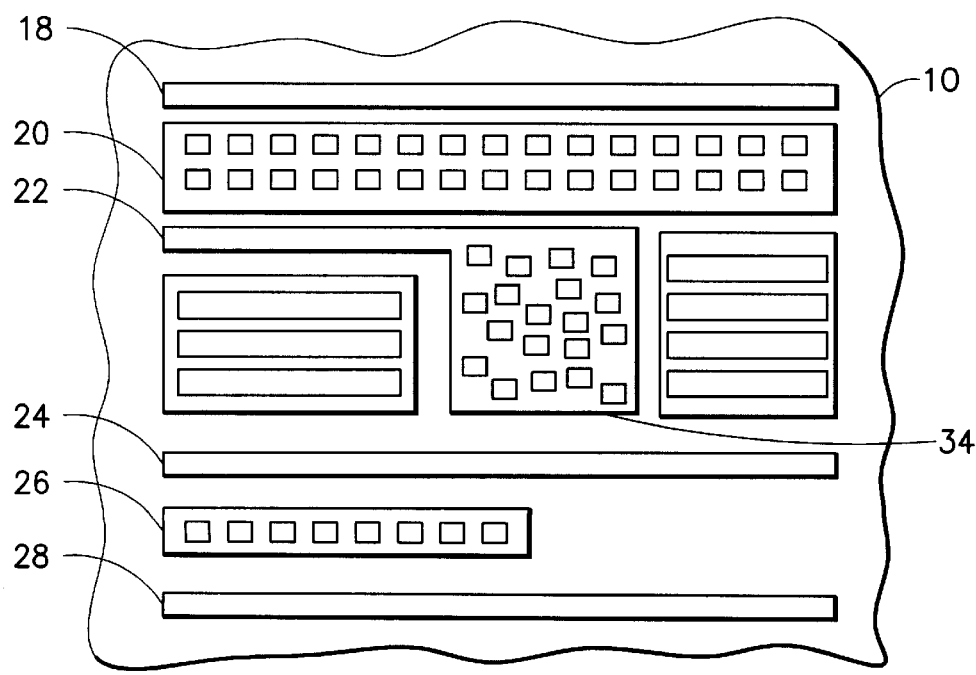
FIG. 4 is a top view of a planarized integrated circuit showing checkerboard tiling of metal lines and fill shapes.

In FIG. 4, a top view of a semiconductor structure substrate 10 is shown including standard lines 18, 20, 22, 24, 26 and 28 and fillshapes 30 and 32. Line 22 is shown having minimum size holes 34 therein. The distribution of the holes 34 can be random to optimize the amount of metal in the line. One or more of the fillshapes may include minimum size holes also to achieve the desired result that the minimum aspect ratio of metal (in cross- section) between two holes is greater than 0.5:1.

FIGS. 4a and 4b are cross-sections A—A and B—B of FIG. 4 illustrating that when holes are added to the structure (i.e. when metal is removed), the same minimum cross-sectional structure is maintained for the metal remaining, and the minimum cross-section of metal is greater than the minimum aspect ratio.

In the present invention the metal and metal lines may be, for example, copper or aluminum.

In a multilayer semiconductor structure a wafer containing conductive lines and circuits is referred to as an active layer, the areas on the active layer containing the conductive lines and circuits are referred to as active regions and the areas that do not contain conductors are referred to as inactive regions. Dummy features, or dummy active segments are features that are added to the active layer in order to equalize the amount of material remaining after the etch of an active layers.

The method of the present invention improves the planarization of SOG and HDPCVD insulators by reducing depressions in the planarized layer by including fill shapes in the mask design, by including minimum size holes in the fill shapes and metal lines such that the minimum aspect ratio of metal (cross-section) between two holes is greater than 0.5:1.

Figure 5:
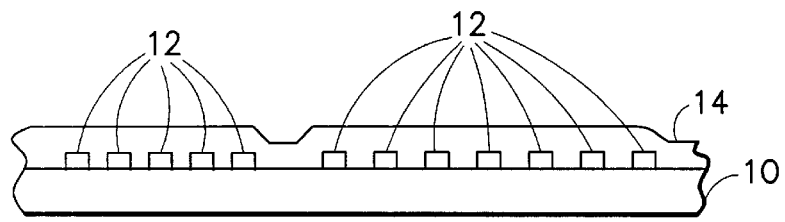
FIG. 5 is a cross-sectional illustration of the embodiment of FIG. 2 after checkerboarding of the wiring line.

FIG. 5 illustrates the cross-section of the conformal film embodiment of FIG. 2 after checkerboarding. In the case of a conformal film the advantage of checkerboarding is minimal.

Figure 6:
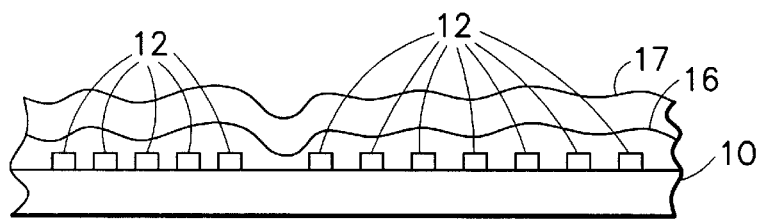
FIG. 6 is a cross-sectional illustration of the embodiment of FIG. 3 after checkerboarding of the wiring line.

FIG. 6 illustrates the cross section of the spun-on-glass embodiment of FIG. 3 after checkerboarding.

Figure 7:
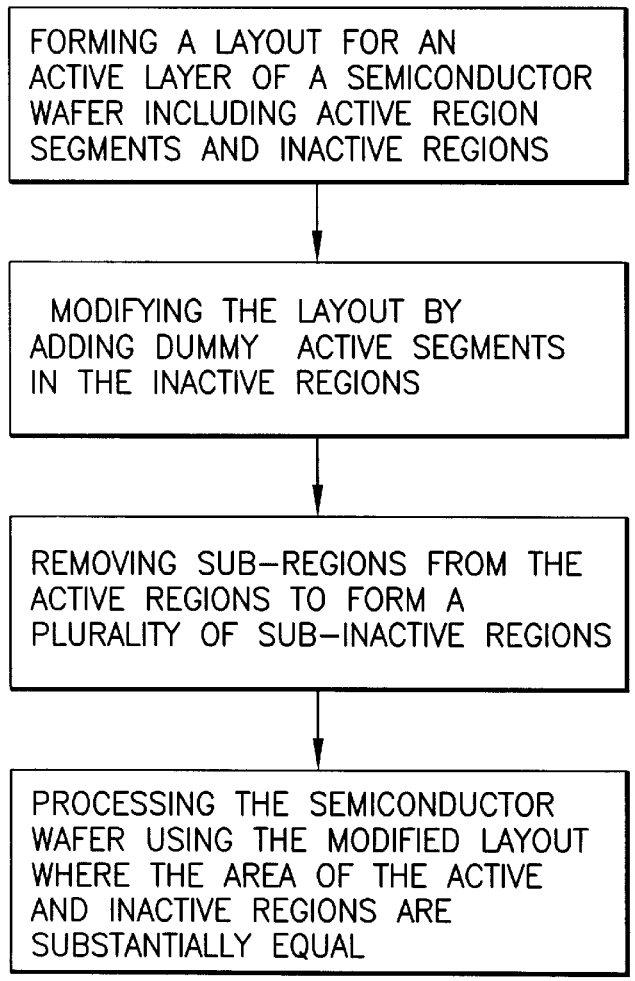
FIG. 7 is a flow chart illustrating the steps in the fabrication method of the present invention.

Referring to FIG. 7, a flow chart is shown that illustrates the sequence of steps used to carry out the present invention.

More particularly, the present invention is a method of fabricating a semiconductor device of the type having a plurality of active layers that includes the steps set forth in FIG. 7 of first forming a layout for at least one of the active layers where the layout contains a plurality of active region segments and a plurality of inactive regions.

The layout is then modified by adding a plurality of dummy active segments in the inactive regions. The layout is further modified by removing a plurality of sub-regions from the active regions to form a plurality of sub-inactive regions.

The semiconductor wafer is then processed using the modified layout to provide an environment during the processing of the active layer wherein the relative area of the active to the inactive regions is substantially equal across the wafer. The semiconductor processing may include subtractive metal processing techniques consisting of metal deposition, patterning and etching, and known damascene processing techniques.

The method of the present invention described hereinabove can be used to make Back End Of Line (BEOL) plate capacitors with tightly controlled capacitance values.

While the invention has been described in connection with a preferred embodiment, it is not intended to limit the scope of the invention to the particular form set forth, but on the contrary, it is intended to cover such alternatives, modifications and equivalence as may be included within the spirit and scope of the invention as defined in the appended claims.

What is claimed is:

1. A method of fabricating a semiconductor device having a plurality of active layers, comprising:

forming a layout for at least one active layer comprising a plurality of active region segments and a plurality of inactive regions;

modifying said layout by removing a plurality of sub-regions from said active regions to form a plurality of sub-inactive regions; and processing a semiconductor wafer using said modified layout to provide an environment during the processing of said active layer wherein the relative area of active to inactive regions is substantially equal across said wafer.

2. The method of claim 1 wherein the at least one active layer is metal and the plurality of active region segments are metal wiring lines.

3. The method of claim 2 wherein said metal wiring lines have a height "a" and a width "b" and wherein the ratio of a:b is greater than 0.5:1.

4. A method of fabricating a semiconductor device according to claim 1 further including the step of modifying said layout by adding a plurality of dummy active segments in said inactive regions prior to said processing step.

5. The method of claim 4 wherein the at least one active layer is metal and the plurality of active region segments are metal wiring lines.

6. The method of claim 5 wherein said metal wiring lines have a height "a" and a width "b" and wherein the ratio of a:b is greater than 0.5:1.

7. A method of fabricating a semiconductor device according to claim 1 wherein said processing step employs subtractive metal processing steps comprising metal deposition, patterning and etching.

8. The method of claim 7 wherein the at least one active layer is metal and the plurality of active region segments are metal wiring lines.

9. The method of claim 8 wherein said metal wiring lines have a height "a" and a width 'b" and wherein the ratio of a:b is greater than 0.5:1.

10. A method of fabricating a semiconductor device according to claim 1 wherein said processing step employs damascene processing.

11. The method of claim 10 wherein the at least one active layer is metal and the plurality of active region segments are metal wiring lines.

12. The method of claim 11 wherein said metal wiring lines have a height "a" and a width "b" and wherein the ratio of a:b is greater than 0.5:1.

13. A method of fabricating a semiconductor device according to claim 1 wherein said processing step includes coating said active and inactive regions with a layer of dielectric material.

14. The method of claim 13 wherein said dielectric layer is formed by chemical vapor deposition.

15. The method of claim 13 wherein said dielectric layer is spun on.

16. The method of claim 2 wherein said metal is copper.

17. The method of claim 2 wherein said metal is aluminum.

* * * * *

UNITED STATES PATENT AND TRADEMARK OFFICE
CERTIFICATE OF CORRECTION

PATENT NO.    : 6,319,818 B1                                    Page 1 of 1
DATED         : November 20, 2001
INVENTOR(S)   : Stamper It is certified that error appears in the above-identified patent and that said Letters Patent is hereby corrected as shown below:

Drawings,
Figs. 4, 4a (A-A) and 4b (B-B), should be deleted and replaced with the corrected Figs. 4, 4a (A-A) and 4b (B-B), as shown below:

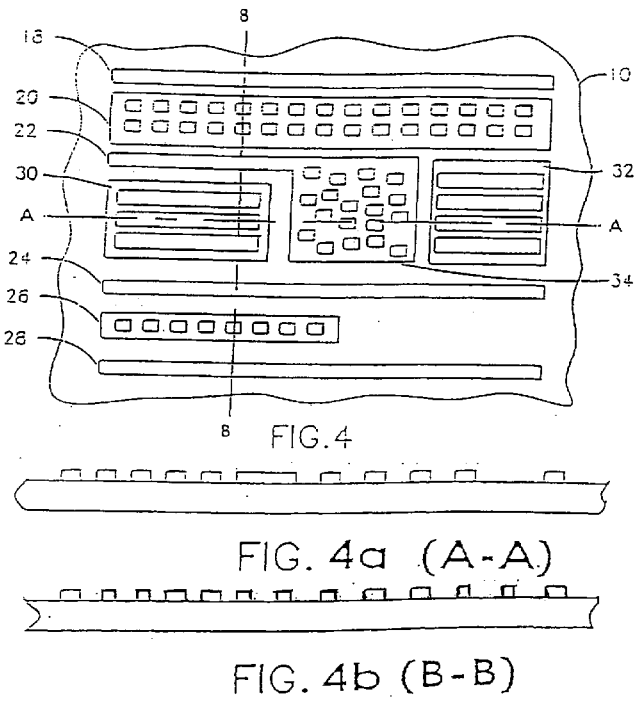

Signed and Sealed this

Twenty-sixth Day of November, 2002

Attest:

JAMES E. ROGAN
Attesting Officer       Director of the United States Patent and Trademark Office